United States Patent [19]

Ranjan

[11] Patent Number: 5,801,418
[45] Date of Patent: Sep. 1, 1998

[54] HIGH VOLTAGE POWER INTEGRATED CIRCUIT WITH LEVEL SHIFT OPERATION AND WITHOUT METAL CROSSOVER

[75] Inventor: Niraj Ranjan, El Segundo, Calif.

[73] Assignee: International Rectifier Corporation, El Segundo, Calif.

[21] Appl. No.: 794,319

[22] Filed: Feb. 3, 1997

Related U.S. Application Data

[60] Provisional application No. 60/011,455, Feb. 12, 1996.
[51] Int. Cl.$^6$ .................................................. H01L 29/72
[52] U.S. Cl. ........................ 257/336; 257/344; 257/379; 257/380; 257/370; 257/373; 257/408; 257/536
[58] Field of Search ................................. 257/336, 344, 257/370, 373, 379, 380, 408, 536

[56] References Cited

U.S. PATENT DOCUMENTS 5,237,193   8/1993   Williams et al. ..................... 257/336

*Primary Examiner*—Edward Wojciechowicz
*Attorney, Agent, or Firm*—Ostrolenk, Faber, Gerb & Soffen, LLP

[57] ABSTRACT

Level shift devices are formed in the high voltage termination region of an integrated circuit. The level shift devices provide a connection between the higher voltage, floating circuit and a ground referenced lower voltage circuit. The structure of the level shift devices eliminates the need for a high voltage connector to cross over the low voltage connector.

67 Claims, 7 Drawing Sheets

HIGH VOLTAGE POWER INTEGRATED CIRCUIT WITH LEVEL SHIFT OPERATION AND WITHOUT METAL CROSSOVER

RELATED APPLICATIONS

This application claims the benefit of U.S. Provisional Application No. 60/011,455, filed Feb. 12, 1996.

BACKGROUND OF THE INVENTION

High voltage power integrated circuits with means for producing level shifted signal outputs are well known. It is frequently necessary in such circuits to have a connector at high voltage cross over other connectors or semiconductor regions that are at a relatively lower voltage. This requires a thick dielectric between the regions of high potential, creating processing problems. The present invention provides a novel structure for eliminating the crossover connector (or conductor) for either a level shift up or level shift down structure.

Typical prior art devices in which the crossover problem exists in the level shift up circuit is the IR2110 Power Integrated Circuit sold by the International Rectifier Corporation. In the IR2120 Power Integrated Circuit, a similar crossover problem exists in the level shift down circuit.

FIG. 1 is a schematic diagram of the level shift up circuit in a die forming the prior art IR2110 device. There is schematically shown a ground referenced control circuit 1, a floating reference circuit 2 contained in a floating well of a common die, a pair of high voltage level shift up MOSFETs 3, two high voltage metal "crossover" connectors 4 extending from the outputs of MOSFETs 3 and connected to the floating reference circuit 2 and a termination region 5 surrounding floating reference circuit 2 to isolate circuit 2 from the ground referenced control circuit 1. All of these circuits are integrated into a common silicon die or chip. Termination 5 of course, contains a blocking junction (not shown). Therefore, connectors 4 must cross over and be insulated from the blocking junction in region 5. For example, a dielectric as thick as 1.5 microns might be needed for products rated at about 500 to 600 volts. This thick dielectric causes serious manufacturing problems.

A similar problem exists with a level shift down circuit such as the circuit shown in the prior art circuit of FIG. 2. In FIG. 2, it will be noted that the level shift MOSFETs 3 are formed in the silicon within the floating reference circuit 2, rather than outside of the circuit 2 as in FIG. 1. As in FIG. 1, however, the connectors 4 must cross over the termination 5 and must be insulated from the high voltage across the termination region 5.

In more detail, and referring to FIG. 1, the input to the chip is received on the ground referenced control circuit 1 side of the die. The input signal is processed and is sent forward through the level shift up MOSFETs 3 to the floating reference circuit 2 side. The high voltage crossover connectors 4 are needed to take the high voltage signal from the drains of the level shift FETs 3 to isolated floating well 2. Since connectors 4 cross over low voltage silicon, the dielectric material between the connectors 4 and the silicon should be thick enough to withstand the full rated "Offset Voltage", between ground referenced and floating reference circuits 1 and 2, respectively. Consequently, in products such as the IR2110 and IR2120 parts, the dielectric is approximately 1.5 microns thick to ensure good yield for a rating of 500 V. For a 1200 V rating, as much as a 3 micron thick dielectric layer is needed. This causes many processing problems and is very difficult to control.

The same problem exists in the structure of FIG. 2.

BRIEF DESCRIPTION OF THE INVENTION

In accordance with the invention, and to eliminate the high voltage crossover needed in the prior art, the level shift MOSFETs are built into the high voltage termination region. Thus, the need for a crossover conductor and a thick insulation layer is eliminated.

In accordance with the present invention, a level shift device electrically couples a floating voltage circuit with a relatively lower voltage circuit, each of which are formed on a common substrate of semiconductor material. A lightly doped layer of semiconductor material is disposed atop of the substrate and is of a first conductivity type. A base region of a second conductivity type is opposite to that of the first conductivity type extends into the upper surface of the layer to a given depth. A source region of the first conductivity type is formed in the base region and defines a surface channel region between the source region and the layer of semiconductor material. A source electrode is connected to the source region and is electrically coupled to the lower voltage circuit. A gate insulation layer is disposed over the channel region, and a conductive layer is disposed over the gate insulation layer. A drain contact diffusion region of the first conductivity type is formed in the upper surface and is laterally spaced away from the base region. A drain electrode is connected to the drain contact diffusion region. A further diffusion region of the first conductivity type is formed in the upper surface of the layer of semiconductor material and is laterally spaced away from the drain region and further away from the base region. The portion of the layer of semiconductor material that is located between the base region and the further diffusion region defines a conduction region. An insulating layer is formed atop the upper surface of the layer of semiconductor material, between the drain region and the further diffusion region. A contact electrode is formed atop the further diffusion region and is electrically coupled to the floating voltage circuit. A conducting resistor layer is located over the insulating layer between the drain electrode and the contact electrode and defines a resistor that is arranged electrically parallel with the conduction region of the layer of semiconductor material. The resistance of the conduction region is greater than the resistance of the conductive resistor layer.

A diffusion region of the second conductivity type may be formed in the upper surface of the layer of semiconductor material to a predetermined depth and located beneath the insulating layer such that the conduction region is reduced. Another body region of a second conductivity type may be formed in the upper surface of the layer of semiconductor material and disposed between the body region and the drain contact diffusion region. A further metal contact may be disposed atop at least a portion of this additional body region and may be electrically connected to the source electrode. A resurf region of the second conductivity type may be formed in the upper surface of the layer of semiconductor material and disposed between the second body region and the drain region in contact with the additional body region.

The source contact region may further contact a portion of the body region. A heavily doped base region of the second conductivity type may be formed in a layer of semiconductor material and extend into the substrate thereby electrically isolating the device.

According to another aspect of the invention, an integrated circuit includes a floating voltage circuit, a relatively lower voltage circuit and a level shift device formed in a common substrate with the floating voltage circuit and the lower voltage circuit.

According to a further aspect of the invention a high voltage MOSFET device electrically couples a floating voltage circuit and a relatively lower voltage circuit which are each formed in a common substrate with the MOSFET device. A layer of semiconductor material of the first conductivity type is disposed above the substrate and is lightly doped and has an upper surface. A source diffusion region of the second conductivity type opposite that of the first conductivity type is formed in the upper surface of the layer of semiconductor material. A source electrode is connected to the source region. A gate insulation layer is disposed over a portion of the upper surface of the layer of semiconductor material adjacent to the source diffusion region, and a conductive gate layer is disposed over the gate insulation layer. A drain region of the second conductivity type is formed in the upper surface of the layer of semiconductor material and is laterally spaced away from the source diffusion region. A drain electrode is disposed atop the drain diffusion. A sinker region of the second conductivity type extends from the upper surface of the layer of semiconductor material and extends into the substrate and is laterally spaced away from the drain region and further spaced away from the source diffusion. A ground electrode is connected to the sinker region. An insulating layer is disposed atop the upper surface of the layer of semiconductor material between the drain electrode and the ground electrode. A conductive resistor layer is disposed atop the insulating layer and is connected between the ground electrode and the drain electrode. The source electrode is electrically coupled to the floating voltage circuit and the drain electrode is electrically coupled to the lower voltage circuit.

An isolation diffusion region of the second conductivity type may be formed in the upper surface and contact the sinker region and be located beneath the insulating layer and laterally spaced away from the drain region to reduce parasitic resistances. A lightly doped resurf region may be formed in the upper surface in contact with the drain region and arranged between the drain region and the source diffusion region. A further diffusion region of the first conductivity type may be formed in the upper surface of the layer of semiconductor material and contact the source diffusion region and the source electrode. At least one gap may be formed in the sinker diffusion region.

According to a still further aspect of the present invention an integrated circuit includes a floating voltage circuit formed in a substrate, a resurf diffusion region substantially surrounding the floating voltage circuit, a relatively lower voltage circuit formed in the substrate, and at least one level shift MOSFET device formed in the substrate and electrically coupled between the high voltage circuit and the low voltage circuit. The MOSFET device is formed in a gap disposed in the resurf region.

According to yet another aspect of the invention, an integrated circuit includes a floating voltage circuit formed in a substrate, a resurf diffusion region that encloses the high voltage circuit, a relatively lower voltage circuit that is formed in the substrate, and at least one level shift MOSFET device formed in the substrate and electrically coupled between the high voltage circuit and the low voltage circuit. The resurf region at least partially encloses the level shift MOSFET device and is disposed between the level shift MOSFET device and the floating voltage device.

A further conductive resistor layer may be connected between the drain electrode and the ground electrode and parallel with a conductive resistor layer.

Other features and advantages of the invention will become apparent from the following description of the invention which refers to the accompanying drawings.

DETAILED DESCRIPTION OF THIS INVENTION

Figure 1:
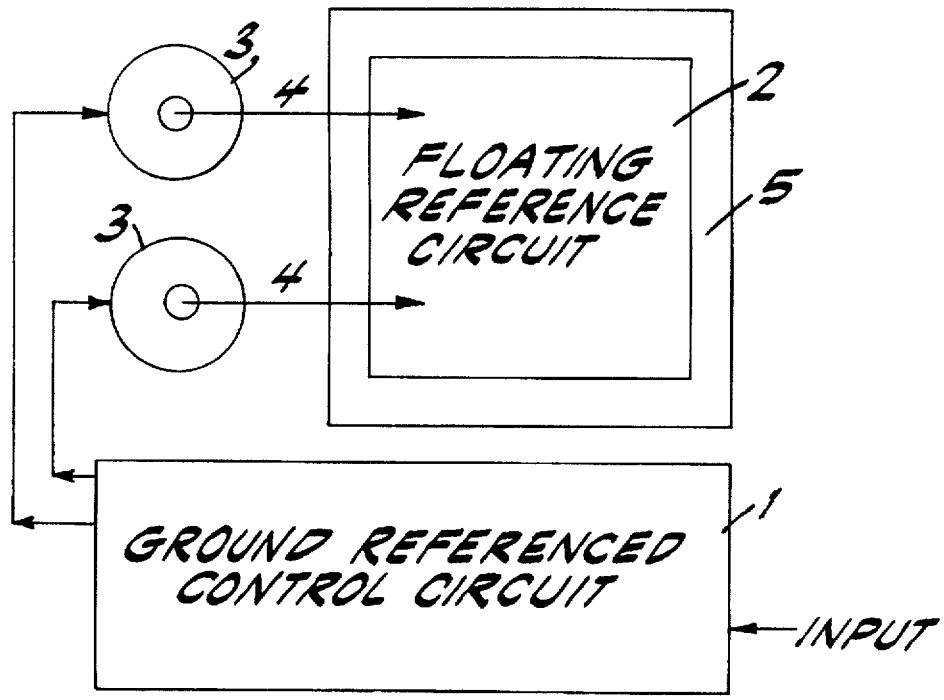
FIG. 1 is a schematic diagram of a prior art level shift up circuit.
Figure 3:
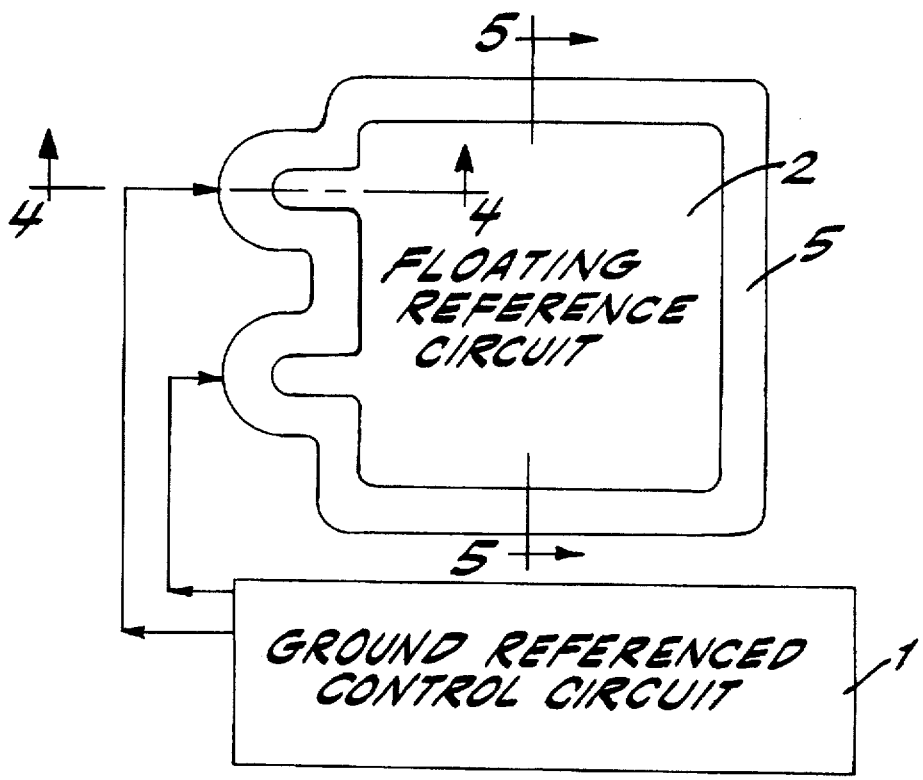
FIG. 3 is a schematic diagram of the level shift up circuit of FIG. 1 when modified to incorporate the present invention.
Figure 4:
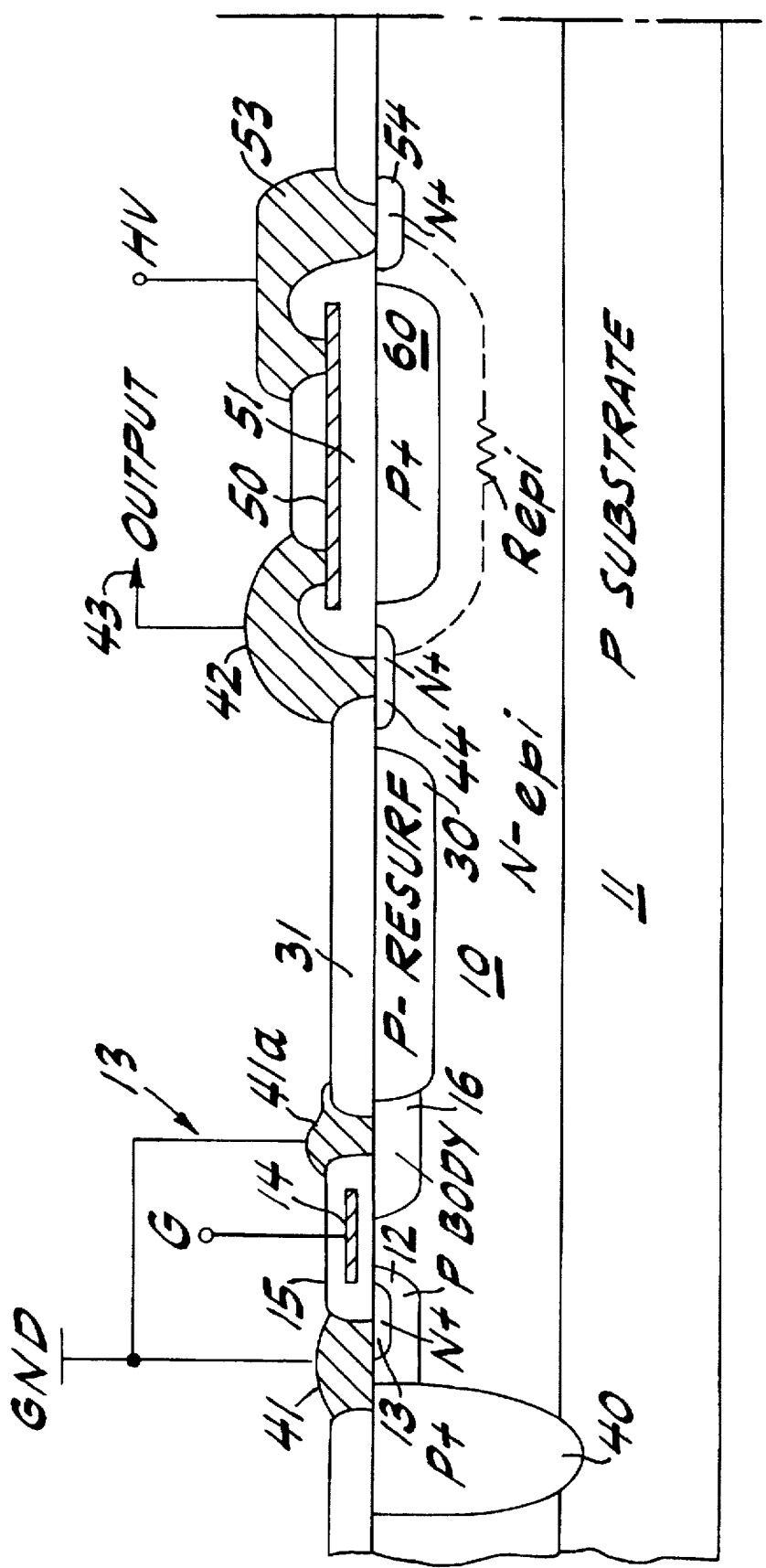
FIG. 4 is a cross-section of FIG. 3 taken across section line 4—4 in a die used for the structure of FIG. 3.
Figure 6:
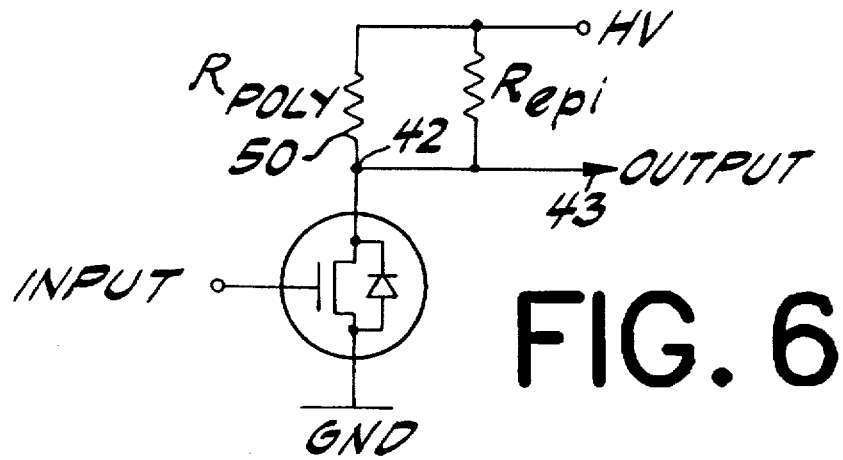
FIG. 6 is a schematic diagram of the structure of FIGS. 3 and 4.

The present invention eliminates the need for the crossover 4 of FIG. 1 for the level shift up circuit of FIG. 1 as shown in FIGS. 3, 4, and 6. Essentially the new design combines the level shift MOSFETs 3 with the high voltage termination 5. In this way, the need for any high voltage crossover connector is eliminated.

FIG. 4, which is a cross-section of FIG. 3 at section line 4—4 in FIG. 3, shows a small portion of the integrated circuit chip, and shows the silicon P type substrate 11 (which may have a resistivity of 10 to 200 ohm cm) and which has an N⁻ epitaxially deposited layer 10 concentric thereon. Ring-shaped P type body regions 12 and 16 are diffused into layer 10 and a source ring 13 is diffused into body 12. A polysilicon gate 14 is deposited atop a conventional gate oxide and covered by an oxide "cap" 15 (conventionally a low temperature oxide) which extends across the channel in body 12 formed by source 13 to define the N channel MOSFET 3 (FIGS. 1 and 6). Ring-shaped diffusion 16 increases device ruggedness.

The N⁻ epitaxial body 10 of FIG. 4 also receives a P⁻ resurf region 30. Low temperature oxide 31, which may contain known spaced voltage dividing polysilicon plates (not shown), may be contained within oxide 31. Such plates are shown in U.S. Pat. No. 5,270,568.

A P⁺ sinker 40 is used to segregate separate devices or integrated circuit wells within the common silicon chip 11.

An aluminum source metal 41 is connected to define the MOSFET 3 source, while its drain is defined by the metallization 42 which defines an output drain terminal 43. P body 16 also receives a metal contact 41a which is suitably connected to source metallizing 41. An N$^+$ diffusion 44 is provided to enable good contact between metal 42 and N$^-$ epi 10.

In accordance with an important feature of the invention, a polysilicon resistor 50 (sometimes referred to as $R_{POLY}$) is deposited atop a field oxide layer 51 (which is covered by a suitable low temperature oxide layer) and is connected at one end to metal 42 and at its other end to high voltage metal 53. Metal 53 is connected to silicon 10 via the N$^+$ diffusion 54. It should be noted that the function of poly resistor 50 could be implemented on other ways, and could, for example, be formed of a diffused P region in the N$^-$ epi 10.

A P$^+$ region 60 is formed under oxide 51 to increase the length of the majority carrier path between diffusions 44 and 54. That is, the resistance of the path beneath the P$^+$ region 60 in the N$^-$ epi 10 has a resistance $R_{epi}$. The diffusion 60 increases the value $R_{epi}$ by pinching the available conduction area in N$^-_{epi}$ 10 between the P$^-$ substrate 11 and the P$^+$ region 60. The added resistor formed by $R_{POLY}$ 50 makes the circuit operate more predictably since it reduces the effect of the variability of $R_{epi}$ which changes as a function of the value of the voltage HV due to depletion effects in the epitaxial layer.

The circuit relationship between $R_{POLY}$ 50 and $R_{epi}$ is shown in FIG. 6. At higher voltage, the depletion region extends further into the epitaxial layer, causing the effective $R_{epi}$ to increase dramatically. The higher value of the level shift resistor makes the circuit more sensitive to dv/dt related malfunctions. Typically, $R_{POLY}$ 50 is about 1,000 ohms while $R_{epi}$ varies from 3,000 ohms at zero bias to a higher effective resistance at high voltage.

Figure 5:
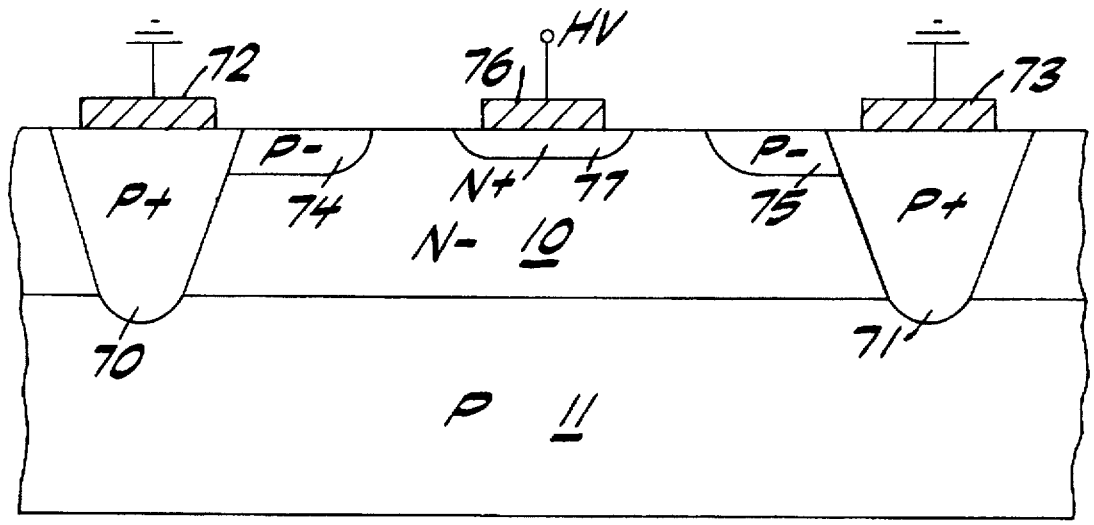
FIG. 5 is a cross-section of FIG. 3 taken across section line 5—5 in FIG. 3.

FIG. 5 shows the termination 5 of FIG. 3, which consists of a pair of P$^+$ sinkers 70 and 71 in epi 10. Grounded metal layers 72 and 73 respectively are atop sinkers 70 and 71, and N$^+$ diffusion 77 receives a metal strip 76. Note that high voltage metal does not extend across the termination. Resurf regions 74 and 75 may also be provided.

Figure 2:
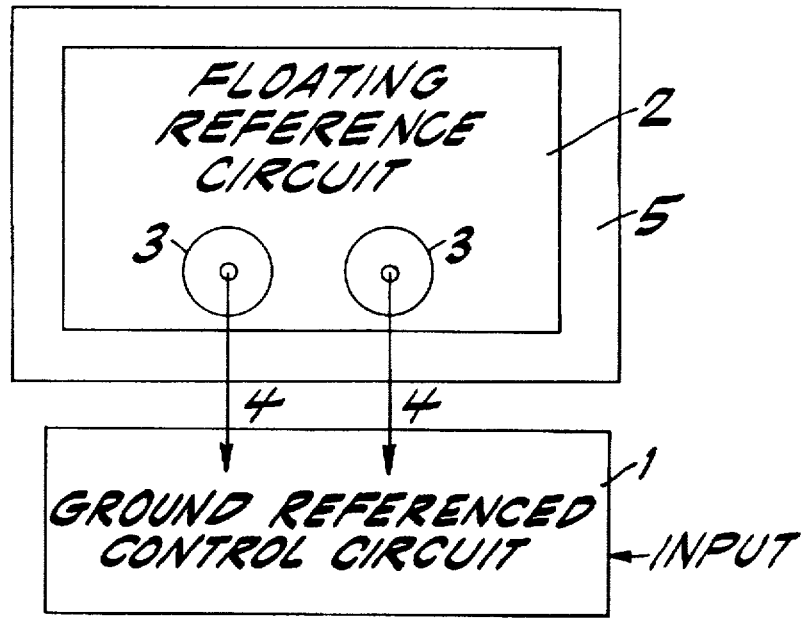
FIG. 2 is a schematic diagram of a prior art level shift-down circuit.

The ring shaped P type body regions of the level shift MOSFETs of FIGS. 3–6 minimize the cross-talk that is present when more than level shift circuit is connected to the same floating circuit. This cross-talk is caused by the presence of the drain terminals in the same epitaxial island, which results in the drains being connected to each other through the parasitic resistance of the epitaxial layer. This type of cross-talk does not occur in the prior art level shift circuit, such as is shown in FIG. 2, where the drains of the respective level shift MOSFETs are located in separate epitaxial layer islands and are isolated from each other.

Figure 14:
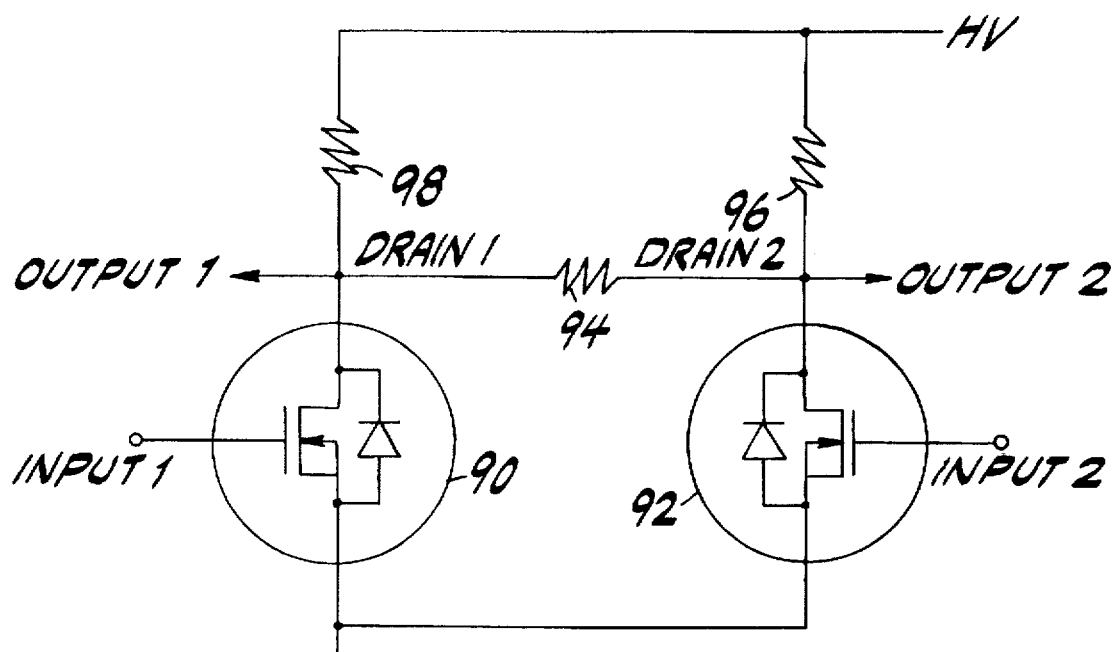
FIG. 14 is a circuit diagram that illustrates the parasitic resistance between the drains of two level shift MOSFETs formed in a common epitaxial region.

The parasitic resistance between the level shift MOSFETs of FIGS. 3–6 is shown in FIG. 14 in which a parasitic resistance 94 is formed between the respective drains of MOSFETs 90 and 92. The parasitic resistance causes a current to flow through resistor 96 whenever MOSFET 90 is activated and can cause false triggering in the floating circuit connected to output2 even when MOSFET 92 is not activated. Similarly, a current can flow through resistor 98 when MOSFET 92 is activated.

The amount of cross-talk depends on the relative values of resistors 96 and 94 when MOSFET 90 is activated, and depends on the relative values of resistors 98 and 94 when MOSFET 92 is activated. Thus the resistance of resistor 94 should be as high as possible to minimize cross-talk. In the level shift circuits shown in FIGS. 3–6, the problem of cross-talk is minimized by forming P type body regions 12 and 16 that maximize the resistance of resistor 94.

Figure 15:
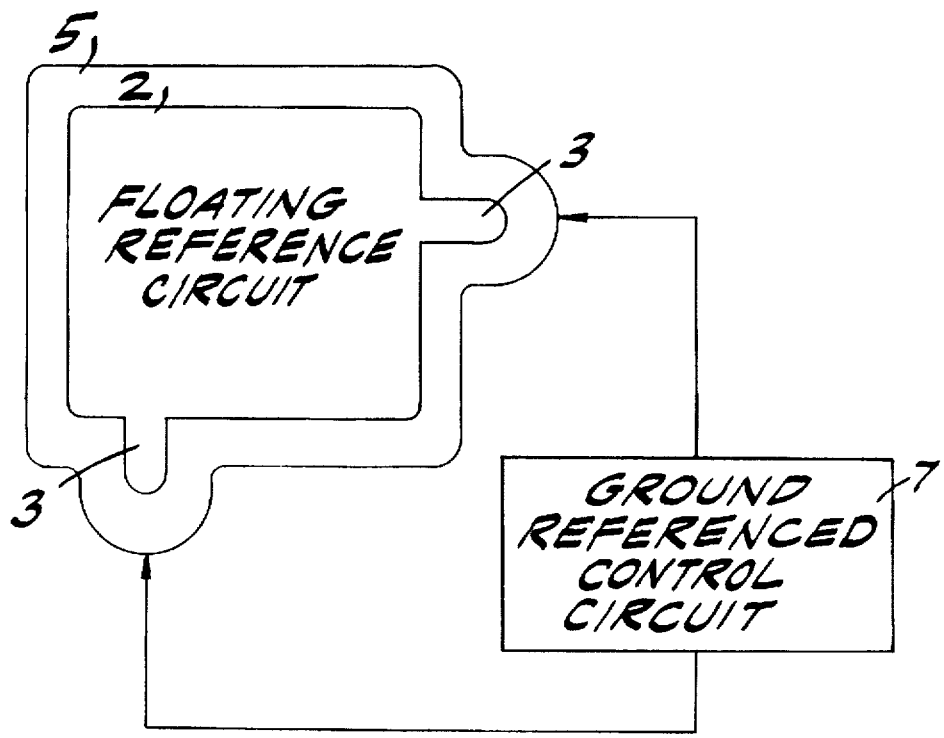
FIG. 15 shows another embodiment of the invention in which the level shift circuits are formed in respective separate epitaxial regions.

Alternatively, the cross-talk problem can be minimized by physically separating the two level shift MOSFETs, as shown in FIG. 15.

To summarize, the salient features of the improvements of FIGS. 3 to 6 are:

1. No high voltage metal crossover by virtue of the layout.
2. An additional level shift resistor 50 (diffused or poly) in parallel with the resistor $R_{epi}$ provides more stable operation of the circuit over a wider range of applied high voltage.
3. Since the $R_{epi}$ is essentially a parasitic element, its effect is minimized by maximizing the distance between N$^+$ diffusions 44 and 54.
4. The added P type diffusion 60 between diffusions 44 and 54 minimizes the effect of $R_{epi}$.
5. The cross-talk among the level-shift MOSFETs within the same floating reference circuit is minimized by providing a ring shaped P type body region as shown in FIG. 3 or by separating the level shift circuits from one another.

Figure 7:
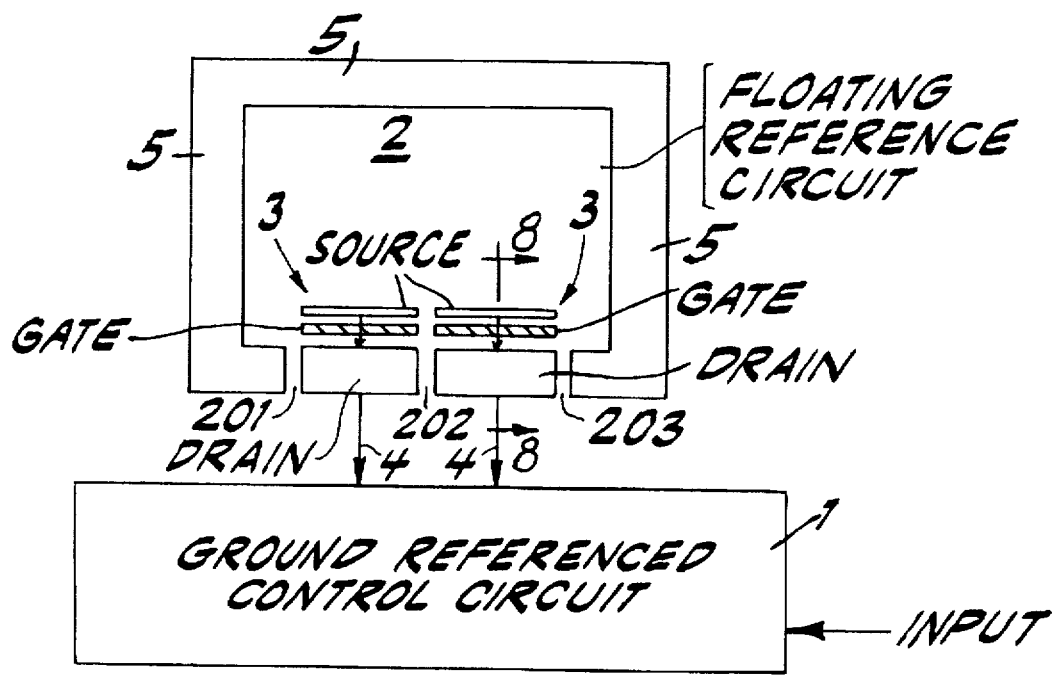
FIG. 7 is a schematic diagram of a level shift down circuit, when modified to incorporate the present invention.
Figure 8:
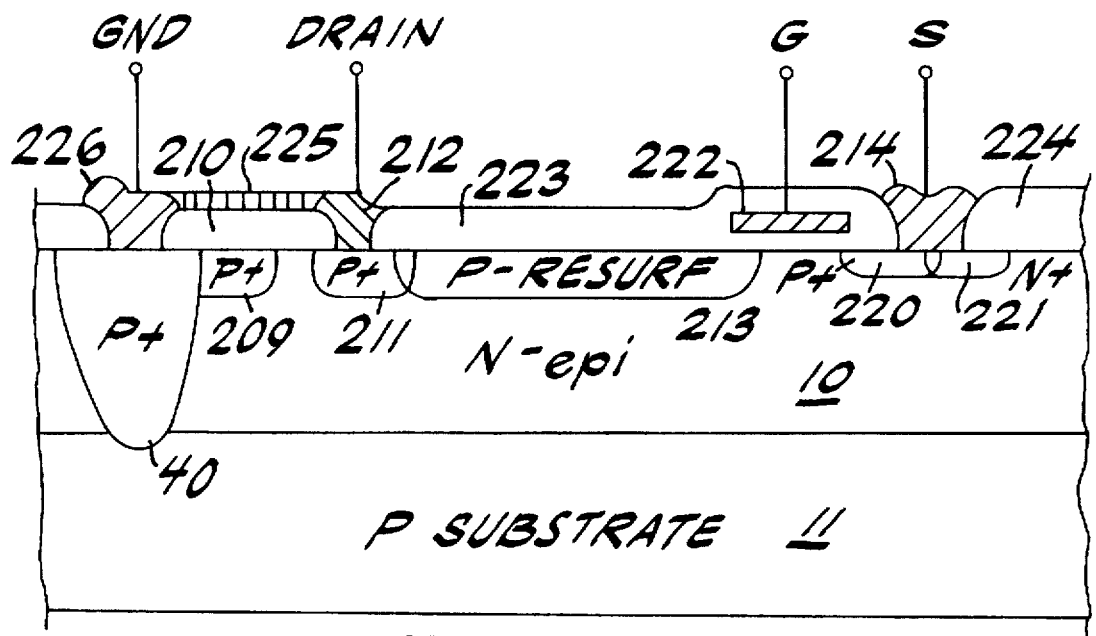
FIG. 8 is a cross-sectional view of FIG. 7, taken across the section line 8—8 in FIG. 7.

Referring next to FIG. 7, there is shown a schematic diagram like that of FIG. 2, but in which the P resurf diffusion portion of region 5 is interrupted at gaps 201, 202 and 203 which may be small, for example, 5 microns each. The silicon chip is then diffused, as shown in FIG. 8, to define the source, gate and drain regions for lateral high voltage PMOS FETs 3 of FIG. 7. Thus, in FIG. 8, numerals similar to those of FIG. 5 designate like components.

It will be noted in FIG. 8 that a P$^+$ region 209 extends from sinker 40 and underlies LTO layer 210. A P$^+$ drain diffusion 211 receives drain contact 212 and P$^-$ resurf diffusion 213 extends from region 211. A source contact 214 contacts P$^+$ diffusion 220 and N$^+$ contact diffusion 221. A polysilicon gate 222 overlies the surface of the N$^-$ epi material exposed between P$^-$ resurf region 213 and P$^+$ region 220. LTO regions 223 and 224 cross over and seal the upper device surface as shown. A polysilicon resistor 225 connects ground contact 226 to drain contact 212.

Figure 9:
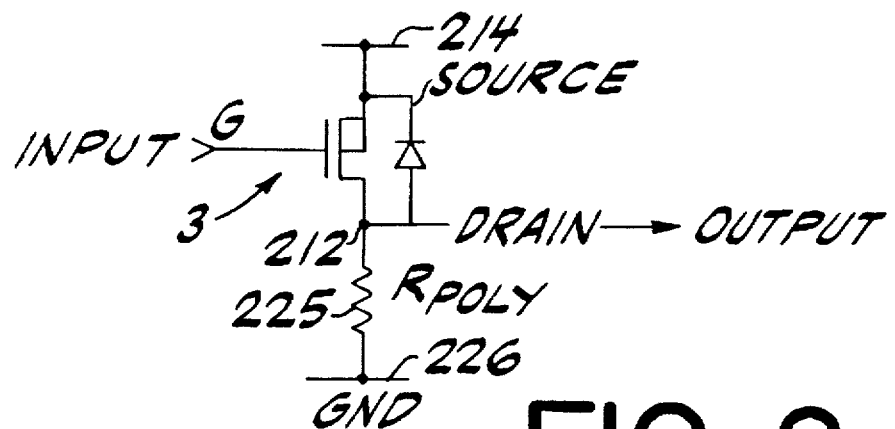
FIG. 9 is a circuit diagram of the level shift down MOSFET in FIGS. 7 and 8.

The resulting device is a high voltage PMOSFET down shift circuit having the circuit diagram shown in FIG. 9. Significantly, the high voltage crossover 4 of FIG. 2 is eliminated.

Also, by spacing the P$^+$ drain 211 from the isolation diffusion 209, the parasitic resistance ($R_{RSF}$ in FIG. 12) is eliminated. Note that this small space is easily depleted at high voltage.

Figure 10:
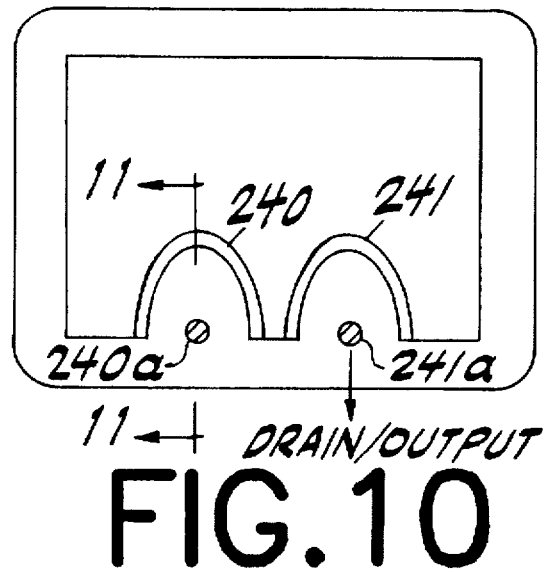
FIG. 10 shows a modification of FIG. 7, with a reshaped termination topology.

FIG. 10 shows another embodiment of a termination region which, as in FIG. 3, is "looped" to increase its length in the area of the level shift MOSFETs. This loop topology also significantly reduces "cross-talk" between the drains of the two MOSFET drains 240a and 241c in FIG. 10 by maximizing the parasitic resistance $R_{CP}$ shown in FIG. 14.

Figure 11:
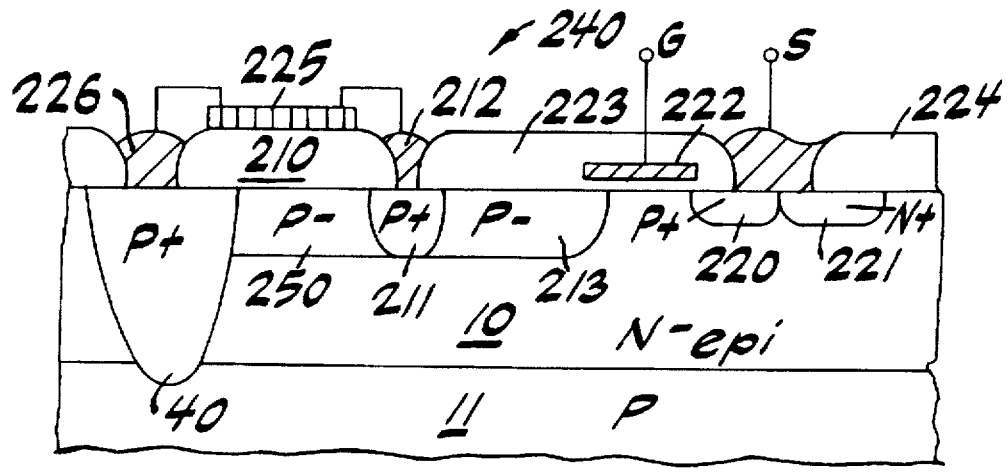
FIG. 11 is a cross-section of FIG. 10 taken across section line 11—11 in FIG. 10.
Figure 12:
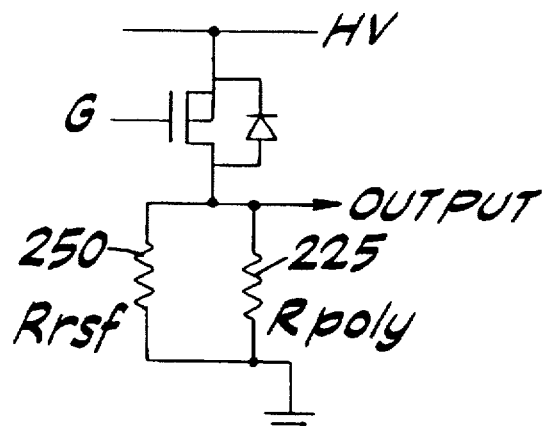
FIG. 12 is a diagram of the circuit of the structure of FIGS. 10 and 11.

Thus, two "loops" 240 and 241 are provided in FIG. 10. The PMOSFETs in these regions are shown in FIG. 11 for a region 240 that includes source region 220. Like numerals in FIG. 11 describe like components of FIG. 8. Note that the P$^-$ region 250 is extended and contacts drain region 211 in FIG. 11. The loops 240 and 241 make the effective value of the parasitic resistance of region 250 as high as possible, thereby to make the resistance of poly resistor 225 the dominant resistor, as shown in FIG. 12.

Figure 13:
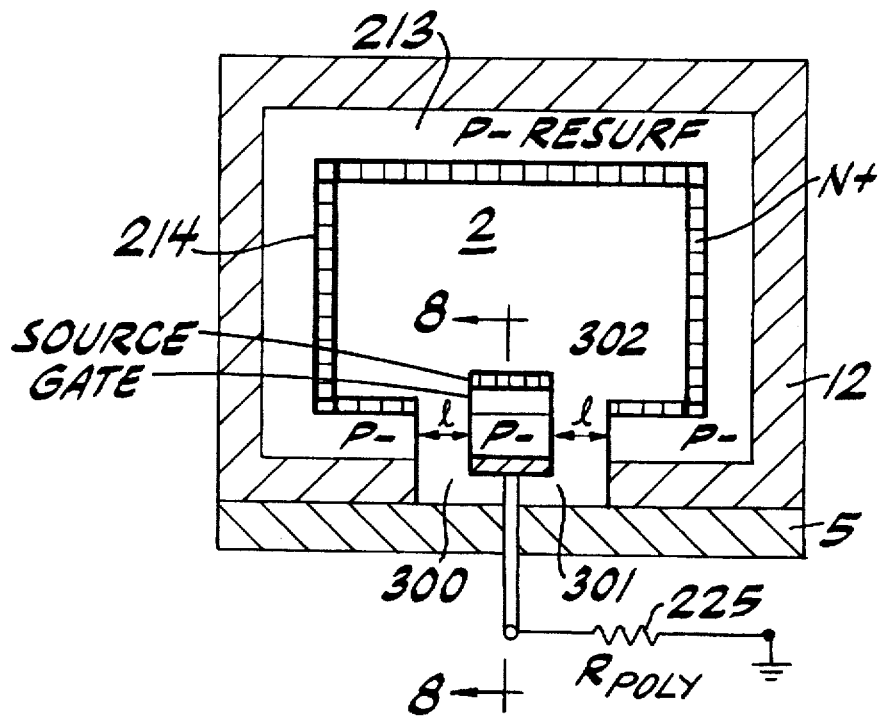
FIG. 13 shows an embodiment of the invention using a single high voltage PMOS device.

FIG. 13 shows the invention for a single down level shifter PMOSFET for the device of FIGS. 7 and 8. Thus, only two gaps 300 and 301 define the high voltage PMOSFET 302. Gaps 300 and 301 are preferably typically 5 microns wide and are small enough to be self isolating. The high voltage diode similar to that is shown in FIG. 5, while the PMOSFET at section lines 8—8 is shown in FIG. 8. Other numerals in FIG. 13 identify like components of FIGS. 7 and 8.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A level shift device for electrically coupling a floating voltage circuit with a relatively lower voltage circuit each formed on a common substrate of semiconductor material with said level shift circuit, said level shift circuit comprising:

a layer of semiconductor material disposed atop said substrate, said semiconductor material being of a first conductivity type and being lightly doped and having an upper surface;

a base region of a second conductivity type opposite to that of said first conductivity type and extending into the upper surface of said layer of semiconductor material to a given depth;

a source region of said first conductivity type formed in said base region and defining a surface channel region between said source region and said layer of semiconductor material;

a source electrode connected to said source region and electrically coupled to said lower voltage circuit;

a gate insulation layer disposed over said channel region;

a conductive gate layer disposed over said gate insulation layer;

a drain contact diffusion region of said first conductivity type formed in said upper surface of said layer of semiconductor material and being laterally spaced away from said base region;

a drain electrode connected to said drain contact diffusion region;

a further diffusion region of said first conductivity type formed in said upper surface of said layer of semiconductor material and being laterally spaced away from said drain region and further away from said base region, the portion of said layer of semiconductor material located between said drain contact diffusion region and said further diffusion region defining a conduction region;

an insulating layer formed atop said upper surface of said layer of semiconductor material and between said drain region and said further diffusion region;

a contact electrode disposed atop said further diffusion region and electrically coupled to said floating voltage circuit; and a conducting resistor layer disposed over said insulating layer between said drain electrode and said contact electrode, thereby defining a resistor that is arranged electrically parallel with said conduction region of said layer of semiconductor material;

the resistance of said conduction region being greater than the resistance of said conductive resistor layer.

2. The device of claim 1 further comprising a diffusion region of said second conductivity type formed in said upper surface of said layer of semiconductor material to a predetermined depth and being located beneath said insulating layer such that the conduction region in said layer of semiconductor material is reduced.

3. The device of claim 1 further comprising another body region of said second conductivity type formed in said upper surface of said layer of semiconductor material and disposed between said body region and said drain contact diffusion region.

4. The device of claim 3 further comprising a further metal contact disposed atop at least a portion of said another body region.

5. The device of claim 4 wherein said further metal contact is electrically connected to said source electrode.

6. The device of claim 3 further comprising a resurf region of said second conductivity type formed in said upper surface of said layer of semiconductor material and disposed between said another body region and said drain diffusion region and in contact with said another body region.

7. The device of claim 1 wherein said source contact electrode further contacts a portion of said body region.

8. The device of claim 1 further comprising a heavily doped spacer region of said second conductivity type formed in said layer of semiconductor material and extending into the substrate for electrically isolating said device.

9. An integrated circuit comprising:

a floating voltage circuit;

a relatively lower voltage circuit; and a level shift device formed in a common substrate with said floating voltage circuit and said lower voltage circuit and comprising:

a layer of semiconductor material disposed atop said substrate, said semiconductor material being of a first conductivity type and being lightly doped and having an upper surface;

a base region of a second conductivity type opposite to that of said first conductivity type and extending into the upper surface of said layer of semiconductor material to a given depth;

a source region of said first conductivity type formed in said base region and defining a surface channel region between said source region and said layer of semiconductor material;

a source electrode connected to said source region and electrically coupled to said lower voltage circuit;

a gate insulation layer disposed over said channel region;

a conductive gate layer disposed over said gate insulation layer;

a drain contact diffusion region of said first conductivity type formed in said upper surface of said layer of semiconductor material and being laterally spaced away from said base region;

a drain electrode connected to said drain contact diffusion region;

a further diffusion region of said first conductivity type formed in said upper surface of said layer of semiconductor material and being laterally spaced away from said drain region and further away from said base region, the portion of said layer of semiconductor material located between said base region and said further diffusion region defining a conduction region;

an insulating layer formed atop said upper surface of said layer of semiconductor material and between said drain region and said further diffusion region;

a contact electrode disposed atop said further diffusion region and electrically coupled to said floating voltage circuit; and a conducting resistor layer disposed over said insulating layer between said drain electrode and said contact electrode, thereby defining a resistor that is arranged electrically parallel with said conduction region of said layer of semiconductor material;

the resistance of said conduction region being greater than the resistance of said conductive resistor layer.

10. The integrated circuit of claim 9 further comprising a diffusion region of said second conductivity type formed in said upper surface of said layer of semiconductor material to a predetermined depth and being located beneath said insulating layer such that the conduction region in said layer of semiconductor material is reduced.

11. The integrated circuit of claim 9 further comprising another body region of said second conductivity type formed in said upper surface of said layer of semiconductor material and disposed between said body region and said drain diffusion region.

12. The integrated circuit of claim 11 further comprising a further metal contact disposed atop at least a portion of said another body region.

13. The integrated circuit of claim 12 wherein said further metal contact is electrically connected to said source electrode.

14. The integrated circuit of claim 11 further comprising a resurf region of said second conductivity type formed in said upper surface of said layer of semiconductor material and disposed between said another body region and said drain diffusion region and in contact with said another body region.

15. The integrated circuit of claim 9 wherein said source contact electrode further contacts a portion of said body region.

16. The integrated circuit of claim 9 further comprising a heavily doped spacer region of said second conductivity type formed in said layer of semiconductor material and extending into the substrate for electrically isolating said device.

17. A device for electrically coupling a floating voltage circuit with a relatively lower voltage circuit each formed in a common substrate with said MOSFET device, said MOSFET device comprising:

a layer of semiconductor material of first conductivity type disposed atop said substrate and being lightly doped and having an upper surface;

a source diffusion region of said second conductivity type opposite to that of said first conductivity type and formed in said upper surface of said layer of semiconductor material;

a source electrode connected to said source region and electrically coupled to said floating voltage circuit;

a gate insulation layer disposed over a portion of said upper surface of said layer of semiconductor material adjacent to said source diffusion region;

a conductive gate layer disposed over said gate insulation layer;

a drain region of said second conductivity type formed in said upper surface of said layer of semiconductor material and being laterally spaced away from said source diffusion region;

a drain electrode disposed atop said drain diffusion and electrically coupled to said lower voltage circuit;

a sinker region of said second conductivity type extending from said upper surface of said layer of semiconductor material and extending into said substrate and being laterally spaced away from said drain region and being further spaced away from said source diffusion;

a ground electrode connected to said sinker region;

an insulating layer disposed atop said upper surface of said layer of semiconductor material between said drain electrode and said ground electrode; and a conductive resistor layer disposed atop said insulating layer and being connected between said ground electrode and said drain electrode.

18. The device of claim 17 further comprising an isolation diffusion region of said second conductivity type formed in said upper surface of said layer of semiconductor material and contacting said sinker region beneath said insulating layer and being laterally spaced away from said drain region to reduce parasitic resistances.

19. The device of claim 17 further comprising a lightly doped resurf region formed in said upper surface of said layer of semiconductor material in contact with said drain region and being arranged between said drain region and said source diffusion region.

20. The device of claim 17 further comprising a further diffusion region of said first conductivity type formed in said upper surface of said layer of semiconductor material and contacting said source diffusion region and said source electrode.

21. The device of claim 17 wherein at least one gap is formed in said sinker diffusion region.

22. An integrated circuit comprising:

a floating voltage circuit formed in a substrate;

a resurf diffusion region substantially surrounding said floating voltage circuit;

a relatively lower voltage circuit formed in said substrate; and at least one level shift MOSFET device formed in said substrate and electrically coupled between said floating voltage circuit and said lower voltage circuit, said MOSFET device being formed in a gap in said resurf region; said MOSFET device comprising:

a layer of semiconductor material of first conductivity type disposed atop said substrate and being lightly doped and having an upper surface;

a source diffusion region of said first conductivity type opposite to that of said first conductivity type and formed in said upper surface of said layer of semiconductor material;

a source electrode connected to said source region and electrically coupled to said floating voltage circuit;

a gate insulation layer disposed over a portion of said upper surface of said layer of semiconductor material adjacent to said source diffusion region;

a conductive gate layer disposed over said gate insulation layer;

a drain region of said second conductivity type formed in said upper surface of said layer of semiconductor material and being laterally spaced away from said source diffusion region;

a drain electrode disposed atop said drain diffusion and electrically coupled to said lower voltage circuit;

a sinker region of said second conductivity type extending from said upper surface of said layer of semiconductor material and extending into said substrate and being laterally spaced away from said drain region and being further spaced away from said source diffusion;

a ground electrode connected to said sinker region;

an insulating layer disposed atop said upper surface of said layer of semiconductor material and arranged between said drain electrode and said ground electrode; and a conductive resistor layer disposed atop said insulating layer and being connected between said ground electrode and said drain electrode.

23. The integrated circuit of claim 22 further comprising an isolation diffusion region of said second conductivity type formed in said upper surface of said layer of semiconductor material and contacting said sinker region beneath said insulating layer and being laterally spaced away from said drain region to reduce parasitic resistances.

24. The integrated circuit of claim 22 further comprising a lightly doped resurf region formed in said upper surface of said layer of semiconductor material in contact with said drain region and being arranged between said drain region and said source diffusion region.

25. The integrated circuit of claim 22 further comprising a further diffusion region of said first conductivity type formed in said upper surface of said layer of semiconductor material and contacting said source diffusion region and said source electrode.

26. An integrated circuit comprising:
a floating voltage circuit formed in a substrate;
a resurf diffusion region enclosing said high voltage circuit;
a relatively lower voltage circuit formed in said substrate; and
at least one level shift MOSFET device formed in said substrate and electrically coupled between said high voltage circuit and said low voltage circuit, said resurf region at least partially enclosing said level shift MOSFET device and disposed between said level shift MOSFET device and said floating voltage device; said MOSFET device comprising:
a layer of semiconductor material of first conductivity type disposed atop said substrate and being lightly doped and having an upper surface;
a source diffusion region of said first conductivity type opposite to that of said first conductivity type formed in said upper surface of said layer of semiconductor material;
a source electrode connected to said source region and electrically coupled to said floating voltage circuit;
a gate insulation layer disposed over a portion of said upper surface of said layer of semiconductor material adjacent to said source diffusion region;
a conductive gate layer disposed over said gate insulation layer;
a drain region of a second conductivity type formed in said upper surface of said layer of semiconductor material and being laterally spaced away from said source diffusion region;
a drain electrode disposed atop said drain diffusion and electrically coupled to said lower voltage circuit;
a sinker region of said second conductivity type extending from said upper surface of said layer of semiconductor material and extending into said substrate and being laterally spaced away from said drain region and being further spaced away from said source diffusion;
a ground electrode connected to said sinker region;
an insulating layer disposed atop said upper surface of said layer of semiconductor material and arranged between said drain electrode and said ground electrode; and
a conductive resistor layer disposed atop said insulating layer and being connected between said ground electrode and said drain electrode.

27. The integrated circuit of claim 26 further comprising a further diffusion region of said second conductivity type formed in said upper surface of said layer of semiconductor material and disposed between and contacting said resurf region and said drain region.

28. The integrated circuit of claim 26 further comprising a lightly doped resurf region formed in said upper surface of said layer of semiconductor material in contact with said drain region and being arranged between said drain region and said source diffusion region.

29. The integrated circuit of claim 26 further comprising a further diffusion region of said first conductivity type formed in said upper surface of said layer of semiconductor material and contacting said source diffusion region and said source electrode.

30. The integrated circuit of claim 26 further comprising a further conductive resistor layer connected between said drain electrode and said ground electrode in parallel with said conductive resistor layer.

31. A level shift device for electrically coupling a floating voltage circuit with a relatively lower voltage circuit each formed on a common substrate of semiconductor material with said level shift circuit, said level shift circuit comprising:
a layer of semiconductor material disposed atop said substrate, said semiconductor material being of a first conductivity type and being lightly doped and having an upper surface;
a base region of a second conductivity type opposite to that of said first conductivity type, said base region extending into the upper surface of said layer of semiconductor material to a given depth and having a substantially semicircular configuration;
a source region of said first conductivity type formed in said base region and defining a surface channel region between said source region and said layer of semiconductor material;
a source electrode connected to said source region and electrically coupled to said lower voltage circuit;
a gate insulation layer disposed over said channel region;
a conductive gate layer disposed over said gate insulation layer;
a drain electrode connected to a portion of said layer of semiconductor material thereby defining a drain region, said drain electrode being laterally spaced away from said base region;
a contact electrode connected to another portion of said layer of semiconductor material and electrically coupled to said floating voltage circuit, the portion of said layer of semiconductor material located between said drain electrode and said contact electrode defining a conduction region; and
a resistor disposed between said drain electrode and said contact electrode, said resistor being arranged electrically parallel with said conduction region of said layer of semiconductor material.

32. The device of claim 31 wherein said resistor comprises a diffusion region of said second conductivity type formed in said upper surface of said layer of semiconductor material to a predetermined depth.

33. The device of claim 31 further comprising another substantially semicircular body region of said second conductivity type formed in said upper surface of said layer of semiconductor material concentric with said body region and disposed between said body region and said drain electrode.

34. The device of claim 33 further comprising a further metal contact disposed atop at least a portion of said another body region.

35. The device of claim 34 wherein said further metal contact is electrically connected to said source electrode.

36. The device of claim 33 further comprising a resurf region of said second conductivity type formed in said upper surface of said layer of semiconductor material and disposed between said another body region and said drain diffusion region and in contact with said another body region.

37. The device of claim 31 wherein said resistor is a conducting layer disposed atop an insulating layer.

38. The device of claim 31 further comprising a heavily doped spacer region of said second conductivity type formed in said layer of semiconductor material and extending into the substrate for electrically isolating said device.

39. An integrated circuit comprising:
a floating voltage circuit;
a relatively lower voltage circuit; and
a level shift device formed in a common substrate with said floating voltage circuit and said lower voltage circuit and comprising:
   a layer of semiconductor material disposed atop said substrate, said semiconductor material being of a first conductivity type and being lightly doped and having an upper surface;
   a base region of a second conductivity type opposite to that of said first conductivity type, said base region extending into the upper surface of said layer of semiconductor material to a given depth and having a substantially semicircular configuration;
   a source region of said first conductivity type formed in said base region and defining a surface channel region between said source region and said layer of semiconductor material;
   a source electrode connected to said source region and electrically coupled to said lower voltage circuit;
   a gate insulation layer disposed over said channel region;
   a conductive gate layer disposed over said gate insulation layer;
   a drain electrode connected to a portion of said layer of semiconductor material thereby defining a drain region; said drain electrode being laterally spaced away from said base region;
   a drain electrode connected to said drain contact diffusion region;
   a contact electrode connected to another portion of said layer of semiconductor material and electrically coupled to said floating voltage circuit, the portion of said layer of semiconductor material located between said base region and said further diffusion region defining a conduction region; and
   a resistor disposed between said drain electrode and said contact electrode, said resistor being arranged electrically parallel with said conduction region of said layer of semiconductor material.

40. The integrated circuit of claim 39 wherein said resistor comprises a diffusion region of said second conductivity type formed in said upper surface of said layer of semiconductor material to a predetermined depth.

41. The integrated circuit of claim 39, further comprising another substantially semicircular body region of said second conductivity type formed in said upper surface of said layer of semiconductor material concentric with said body region and disposed between said body region and said drain electrode.

42. The integrated circuit of claim 41 further comprising a further metal contact disposed atop at least a portion of said another body region.

43. The integrated circuit of claim 42 wherein said further metal contact is electrically connected to said source electrode.

44. The integrated circuit of claim 41 further comprising a resurf region of said second conductivity type formed in said upper surface of said layer of semiconductor material and disposed between said another body region and said drain diffusion region and in contact with said another body region.

45. The integrated circuit of claim 39 wherein said resistor is a conducting layer disposed atop an insulating layer.

46. The integrated circuit of claim 39 further comprising a heavily doped spacer region of said second conductivity type formed in said layer of semiconductor material and extending into the substrate for electrically isolating said device.

47. A device for electrically coupling a floating voltage circuit with a relatively lower voltage circuit each formed in a common substrate with said MOSFET device, said MOSFET device comprising:
   a layer of semiconductor material of first conductivity type disposed atop said substrate and being lightly doped and having an upper surface;
   a source diffusion region of said second conductivity type opposite to that of said first conductivity type and formed in said upper surface of said layer of semiconductor material;
   a source electrode connected to said source region and electrically coupled to said floating voltage circuit;
   a gate insulation layer disposed over a portion of said upper surface of said layer of semiconductor material adjacent to said source diffusion region;
   a conductive gate layer disposed over said gate insulation layer;
   a drain region of said second conductivity type formed in said upper surface of said layer of semiconductor material and being laterally spaced away from said source diffusion region;
   a drain electrode disposed atop said drain diffusion and electrically coupled to said lower voltage circuit; and
   a resistor connected between said ground electrode and said drain electrode.

48. The device of claim 47 further comprising a sinker region of said second conductivity type extending from said upper surface of said layer of semiconductor material and extending into said substrate and being laterally spaced away from said drain region and being further spaced away from said source diffusion; and
   a ground electrode connected to said sinker region.

49. The device of claim 48 further comprising an isolation diffusion region of said second conductivity type formed in said upper surface of said layer of semiconductor material and contacting said sinker region and being laterally spaced away from said drain region to reduce parasitic resistances.

50. The device of claim 47 further comprising a lightly doped resurf region formed in said upper surface of said layer of semiconductor material in contact with said drain region and being arranged between said drain region and said source diffusion region.

51. The device of claim 47 further comprising a further diffusion region of said first conductivity type formed in said upper surface of said layer of semiconductor material and contacting said source diffusion region and said source electrode.

52. An integrated circuit comprising:
a floating voltage circuit formed in a substrate;

a resurf diffusion region substantially surrounding said floating voltage circuit;

a relatively lower voltage circuit formed in said substrate; and at least one level shift MOSFET device formed in said substrate and electrically coupled between said floating voltage circuit and said lower voltage circuit, said MOSFET device being formed in a gap in said resurf region; said MOSFET device comprising:

a layer of semiconductor material of first conductivity type disposed atop said substrate and being lightly doped and having an upper surface;

a source diffusion region of said first conductivity type opposite to that of said first conductivity type and formed in said upper surface of said layer of semiconductor material;

a source electrode connected to said source region and electrically coupled to said floating voltage circuit;

a gate insulation layer disposed over a portion of said upper surface of said layer of semiconductor material adjacent to said source diffusion region;

a conductive gate layer disposed over said gate insulation layer;

a drain region of said second conductivity type formed in said upper surface of said layer of semiconductor material and being laterally spaced away from said source diffusion region;

a drain electrode disposed atop said drain diffusion and electrically coupled to said lower voltage circuit; and a resistor connected between said ground electrode and said drain electrode.

53. The integrated circuit of claim 52 further comprising a sinker region of said second conductivity type extending from said upper surface of said layer of semiconductor material and extending into said substrate and being laterally spaced away from said drain region and being further spaced away from said source diffusion; and a ground electrode connected to said sinker region.

54. The integrated circuit of claim 53 further comprising an isolation diffusion region of said second conductivity type formed in said upper surface of said layer of semiconductor material and contacting said sinker region beneath said insulating layer and being laterally spaced away from said drain region to reduce parasitic resistances.

55. The integrated circuit of claim 52 further comprising a lightly doped resurf region formed in said upper surface of said layer of semiconductor material in contact with said drain region and being arranged between said drain region and said source diffusion region.

56. The integrated circuit of claim 52 further comprising a further diffusion region of said first conductivity type formed in said upper surface of said layer of semiconductor material and contacting said source diffusion region and said source electrode.

57. A device for electrically coupling a floating voltage circuit with a relatively lower voltage circuit each formed in a common substrate with said MOSFET device, said MOSFET device comprising:

a layer of semiconductor material of first conductivity type disposed atop said substrate and being lightly doped and having an upper surface;

a source diffusion region of said second conductivity type opposite to that of said first conductivity type, said source diffusion region being formed in said upper surface of said layer of semiconductor material and having a substantially semicircular configuration;

a source electrode connected to said source region and electrically coupled to said floating voltage circuit;

a gate insulation layer disposed over a portion of said upper surface of said layer of semiconductor material adjacent to said source diffusion region;

a conductive gate layer disposed over said gate insulation layer;

a drain region of said second conductivity type formed in said upper surface of said layer of semiconductor material and being laterally spaced away from said source diffusion region;

a drain electrode disposed atop said drain diffusion and electrically coupled to said lower voltage circuit; and a resistor connected between said ground electrode and said drain electrode.

58. The device of claim 57 further comprising a sinker region of said second conductivity type extending from said upper surface of said layer of semiconductor material and extending into said substrate and being laterally spaced away from said drain region and being further spaced away from said source diffusion; and a ground electrode connected to said sinker region.

59. The device of claim 58 further comprising an isolation diffusion region of said second conductivity type formed in said upper surface of said layer of semiconductor material and contacting said sinker region and said drain region.

60. The device of claim 57 further comprising a lightly doped resurf region formed in said upper surface of said layer of semiconductor material in contact with said drain region and being arranged between said drain region and said source diffusion region.

61. The device of claim 57 further comprising a further diffusion region of said first conductivity type formed in said upper surface of said layer of semiconductor material and contacting said source diffusion region and said source electrode.

62. An integrated circuit comprising:

a floating voltage circuit formed in a substrate;

a resurf diffusion region enclosing said high voltage circuit;

a relatively lower voltage circuit formed in said substrate; and at least one level shift MOSFET device formed in said substrate and electrically coupled between said high voltage circuit and said low voltage circuit, said resurf region at least partially enclosing said level shift MOSFET device and disposed between said level shift MOSFET device and said floating voltage device; said MOSFET device comprising:

a layer of semiconductor material of first conductivity type disposed atop said substrate and being lightly doped and having an upper surface;

a source diffusion region of said first conductivity type opposite to that of said first conductivity type, said source diffusion region being formed in said upper surface of said layer of semiconductor material and having a substantially semicircular configuration;

a source electrode connected to said source region and electrically coupled to said floating voltage circuit;

a gate insulation layer disposed over a portion of said upper surface of said layer of semiconductor material adjacent to said source diffusion region;

a conductive gate layer disposed over said gate insulation layer;

a drain region of a second conductivity type formed in said upper surface of said layer of semiconductor material and being laterally spaced away from said source diffusion region;

a drain electrode disposed atop said drain diffusion and electrically coupled to said lower voltage circuit; and a resistor connected between said ground electrode and said drain electrode.

63. The integrated circuit of claim 62 further comprising a sinker region of said second conductivity type extending from said upper surface of said layer of semiconductor material and extending into said substrate and being laterally spaced away from said drain region and being further spaced away from said source diffusion; and a ground electrode connected to said sinker region.

64. The integrated circuit of claim 63 further comprising a further diffusion region of said second conductivity type formed in said upper surface of said layer of semiconductor material and disposed between and contacting said resurf region and said drain region.

65. The integrated circuit of claim 62 further comprising a lightly doped resurf region formed in said upper surface of said layer of semiconductor material in contact with said drain region and being arranged between said drain region and said source diffusion region.

66. The integrated circuit of claim 62 further comprising a further diffusion region of said first conductivity type formed in said upper surface of said layer of semiconductor material and contacting said source diffusion region and said source electrode.

67. The integrated circuit of claim 64 wherein said further diffusion region comprises a further conductive resistor connected between said drain electrode and said ground electrode in parallel with said conductive resistor layer.

* * * * *

UNITED STATES PATENT AND TRADEMARK OFFICE
CERTIFICATE OF CORRECTION

PATENT NO. : 5,801,418
DATED : September 1, 1998
INVENTOR(S) : Niraj RANJAN

It is certified that error appears in the above-indentified patent and that said Letters Patent is hereby corrected as shown below:

In Claim 17, line 1, after "A" insert --MOSFET--.

In Claim 47, line 1, after "A" insert --MOSFET--.

In Claim 57, line 1, after "A" insert --MOSFET--.

Signed and Sealed this

Twenty-fourth Day of August, 1999

Attest:

Q. TODD DICKINSON

Attesting Officer

Acting Commissioner of Patents and Trademarks